(12) United States Patent
Seiller et al.

(10) Patent No.: US 7,919,864 B2
(45) Date of Patent: Apr. 5, 2011

(54) FORMING OF THE LAST METALLIZATION LEVEL OF AN INTEGRATED CIRCUIT

(75) Inventors: Jacky Seiller, Veurey Voroize (FR); Jean-François Revel, Crolles (FR); Claude Douce, Miribel-les-Echelles (FR)

(73) Assignee: STMicroelectronics S.A., Montrouge (FR)

( * ) Notice: Subject to any disclaimer, the term of this patent is extended or adjusted under 35 U.S.C. 154(b) by 160 days.

(21) Appl. No.: 10/791,136

(22) Filed: Mar. 2, 2004

(65) Prior Publication Data

US 2005/0077626 A1   Apr. 14, 2005

(30) Foreign Application Priority Data

Oct. 13, 2003   (FR) ..................................... 03 50672

(51) Int. Cl.
*H01L 29/40* (2006.01)
*H01L 21/4763* (2006.01)
(52) U.S. Cl. ......... 257/758; 257/759; 257/760; 438/622
(58) Field of Classification Search ............... 438/688
See application file for complete search history.

(56) References Cited

U.S. PATENT DOCUMENTS

| 4,576,900 | A | * | 3/1986 | Chiang | 430/313 |
|---|---|---|---|---|---|
| 5,476,815 | A | * | 12/1995 | Kawasumi | 438/613 |
| 5,525,546 | A | * | 6/1996 | Harada et al. | 438/612 |
| 5,693,567 | A | * | 12/1997 | Weisfield et al. | 438/648 |
| 6,110,816 | A | * | 8/2000 | Huang et al. | 438/612 |
| 6,221,752 | B1 | | 4/2001 | Chou et al. | |
| 6,287,950 | B1 | * | 9/2001 | Wu et al. | 438/612 |
| 6,358,831 | B1 | * | 3/2002 | Liu et al. | 438/612 |
| 6,437,418 | B1 | * | 8/2002 | Ferrari et al. | 257/531 |
| 6,489,647 | B1 | * | 12/2002 | Lin | 257/300 |
| 6,515,369 | B1 | * | 2/2003 | Lin | 257/773 |
| 6,522,021 | B2 | * | 2/2003 | Sakihama et al. | 257/784 |
| 6,593,222 | B2 | * | 7/2003 | Smoak | 438/615 |
| 6,610,601 | B2 | * | 8/2003 | Li et al. | 438/687 |
| 6,743,707 | B2 | * | 6/2004 | Tong et al. | 438/612 |
| 6,756,678 | B2 | * | 6/2004 | Chopra et al. | 257/762 |
| 6,787,918 | B1 | * | 9/2004 | Tsai et al. | 257/778 |
| 6,815,324 | B2 | * | 11/2004 | Huang et al. | 438/612 |

(Continued)

FOREIGN PATENT DOCUMENTS

JP   406097292 A   *   4/1994

OTHER PUBLICATIONS

French Search Report from corresponding French Application No. 03 50672, filed Sep. 4, 2001.

(Continued)

*Primary Examiner* — Matthew C Landau
*Assistant Examiner* — James M Mitchell
(74) *Attorney, Agent, or Firm* — Lisa K. Jorgenson; James H. Morris; Wolf, Greenfield & Sacks, P.C.

(57) ABSTRACT

An integrated circuit including one or several metallization levels, metal conductive strips and metal contact pads being formed on the last metallization level, the last level being covered with a passivation layer in which are formed openings above the contact pads. The thickness of the pads, at least at the level of their portions not covered by the passivation layer, is smaller than the thickness of said conductive strips.

8 Claims, 4 Drawing Sheets

U.S. PATENT DOCUMENTS

| | | | |
|---|---|---|---|
| 6,828,670 B2 * | 12/2004 | Hayama et al. | 257/700 |
| 6,870,256 B2 * | 3/2005 | Aoki et al. | 257/700 |
| 7,067,928 B2 * | 6/2006 | Yamaha | 257/781 |
| 7,157,794 B2 * | 1/2007 | Mori | 257/728 |
| 7,315,072 B2 * | 1/2008 | Watanabe | 257/503 |
| 2001/0013657 A1 * | 8/2001 | Anand | 257/758 |
| 2001/0030363 A1 * | 10/2001 | Chopra et al. | 257/734 |
| 2002/0011653 A1 * | 1/2002 | Ferrari et al. | 257/678 |
| 2002/0025585 A1 * | 2/2002 | Lam et al. | 438/1 |
| 2002/0063340 A1 * | 5/2002 | Sahara et al. | 257/773 |
| 2002/0146898 A1 * | 10/2002 | Aoki | 438/617 |
| 2003/0042620 A1 * | 3/2003 | Hedler et al. | 257/784 |
| 2003/0119297 A1 * | 6/2003 | Lam et al. | 438/612 |
| 2003/0127704 A1 * | 7/2003 | Kobayashi et al. | 257/531 |
| 2004/0115924 A1 * | 6/2004 | Lee et al. | 438/629 |
| 2004/0157438 A1 * | 8/2004 | Yamashita et al. | 438/674 |

OTHER PUBLICATIONS

Patent abstracts of Japan, vol. 007, No. 154 (E-185), Jul. 6, 1983 & JP 58 064039, Apr. 16, 1983.

Patent abstracts of Japan, vol. 008, No. 029 (E-226), Feb. 8, 2984 & JP 58 192338, Nov. 9, 1983.

* cited by examiner

FORMING OF THE LAST METALLIZATION LEVEL OF AN INTEGRATED CIRCUIT

BACKGROUND OF THE INVENTION

1. Field of the Invention

The present invention relates to integrated circuits and more specifically to input/output contact pads formed on the last metallization level of integrated circuits.

2. Discussion of the Related Art

FIGS. 1 and 2, respectively, are a partial top view and a corresponding cross-section view of the last metallization level of an exemplary integrated circuit. A coil 1 and a contact pad 2 are formed on a substrate 3. Substrate 3 is an insulating layer covering a previous metallization level or a semiconductor substrate. Coil 1 is spiral-shaped in top view and five portions 5, 6, 7, 8 and 9 are visible in FIG. 2. Contact pad 2 is square-shaped in top view as current in integrated circuits. A passivation layer 10 covers the coil and substrate 3, as well as the edges of contact pad 2. An opening 11 in passivation layer 10 exposes a central portion of contact pad 2.

The forming of the last metallization level of an integrated circuit such as shown in FIGS. 1 and 2 consists of covering substrate 3 with a metal layer, generally made of aluminum, then etching this metal layer to form coil 1 and contact pad 2, and finally covering the entire structure with a passivation layer in which an opening is formed above contact pad 2.

The development of integrated circuit manufacturing processes enables placing more and more elements on the same substrate surface area. On a given metallization level, the width of the conductive strips is smaller and smaller. Similarly, the size and the spacing of the contact pads are decreased to increase their number.

FIG. 3 is a cross-section view of the contact pad of FIG. 2 after welding of a metal wire. The tip of the metal wire substantially has the shape of a ball 20 resting on contact pad 2. Upon welding, ball 20 is laid on contact pad 2, and a strong force, as well as ultrasound, are applied to form an intermetallic welding area 21 between ball 20 and contact pad 2.

Since aluminum is a relatively flexible material, the application of a strong force and of ultrasound causes a penetration of ball 20 into contact pad 2 and results on the one hand in the forming of cracks 22 in passivation layer 10, and on the other hand in the forming of aluminum projections 23 on either side of ball 20, some of the projections rising above passivation layer 10. The presence of cracks 22 and of aluminum projections 23 is likely to cause short-circuits between the input/output contact pads generally placed next to one another and this, becomes more likely as the pads get closer and closer. This results in reliability problems for the concerned integrated circuits.

SUMMARY OF THE INVENTION

An object of the present invention is to provide an integrated circuit comprising on its last metallization level lightly-resistive conductive strips and small-size metal conductive pads.

Another object of the present invention is to provide a method for manufacturing an integrated circuit exhibiting on its last metallization level lightly-resistive conductive strips and small-size metal contact pads.

To achieve these and other objects, the present invention provides an integrated circuit comprising one or several metallization levels, metal conductive strips and metal contact pads being formed on the last metallization level, the last level being covered with a passivation layer in which are formed openings above the contact pads. The thickness of the pads, at least at the level of their portions not covered by the passivation layer, is smaller than the thickness of said conductive strips.

According to an embodiment of the present invention, at least one conductive strip forms a coil.

According to an embodiment of the present invention, several of said conductive strips form a supply network.

According to an embodiment of the present invention, the last metallization level is formed on an insulating layer, each contact pad being formed of a conductive layer covering an insulating portion laid on the insulating layer.

According to an embodiment of the present invention, the contact pads are made of aluminum.

The present invention also provides a method for forming the last metallization level of an integrated circuit comprising:

depositing a metal layer on a substrate;

etching the metal layer to form metal portions and said conductive strips;

covering the substrate, the conductive strips, and the metal portions with a passivation layer;

forming openings in the passivation layer above the metal portions; and partially etching the metal portions to decrease their thickness to obtain said contact pads.

The present invention also provides a method for forming the last metallization level of an integrated circuit comprising:

depositing a metal layer on a substrate;

etching the metal layer to form metal portions and said conductive strips;

covering the conductive strips with a protection layer;

partially etching the metal portions to decrease their thickness to obtain said contact pads;

removing, if necessary, the protection layer;

covering the substrate, the conductive strips, and the contact pads with a passivation layer; and forming openings in the passivation layer above the contact pads.

The foregoing objects, features, and advantages of the present invention will be discussed in detail in the following non-limiting description of specific embodiments in connection with the accompanying drawings.

DETAILED DESCRIPTION

Figure 1:
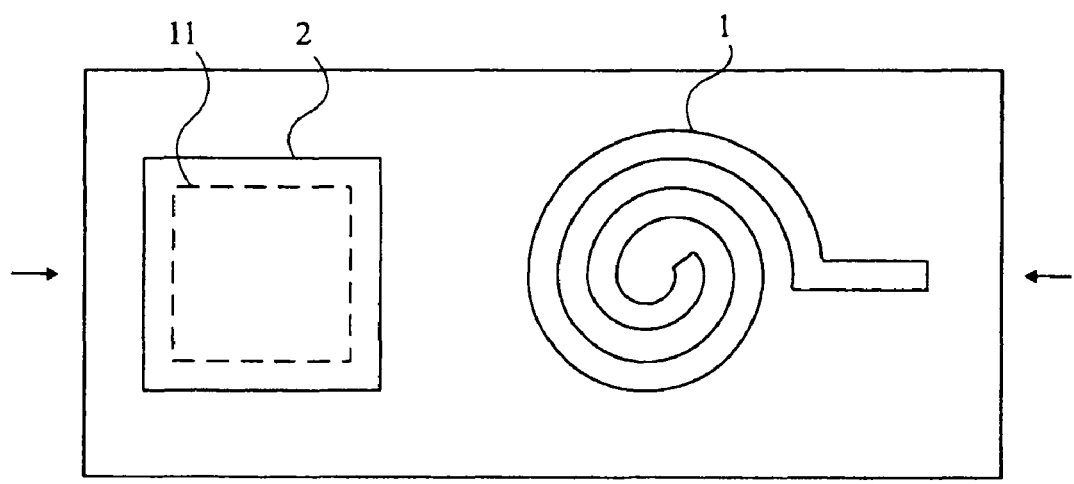
FIG. 1 is a top view of an integrated circuit according to prior art.
Figure 2:
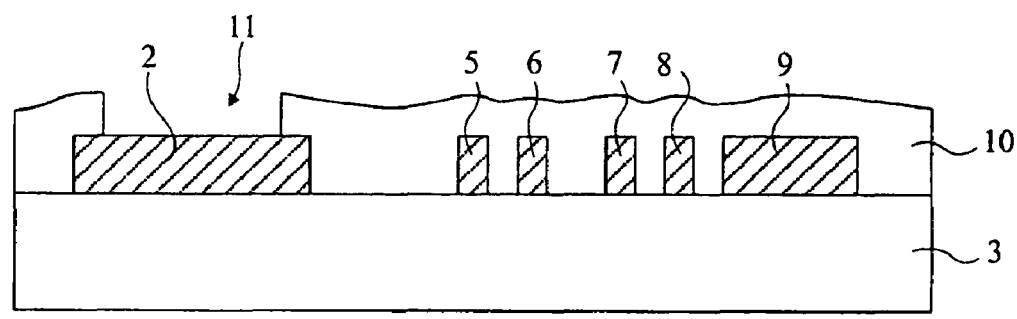
FIG. 2 is a cross-section view of the integrated circuit of FIG. 1.
Figure 3:
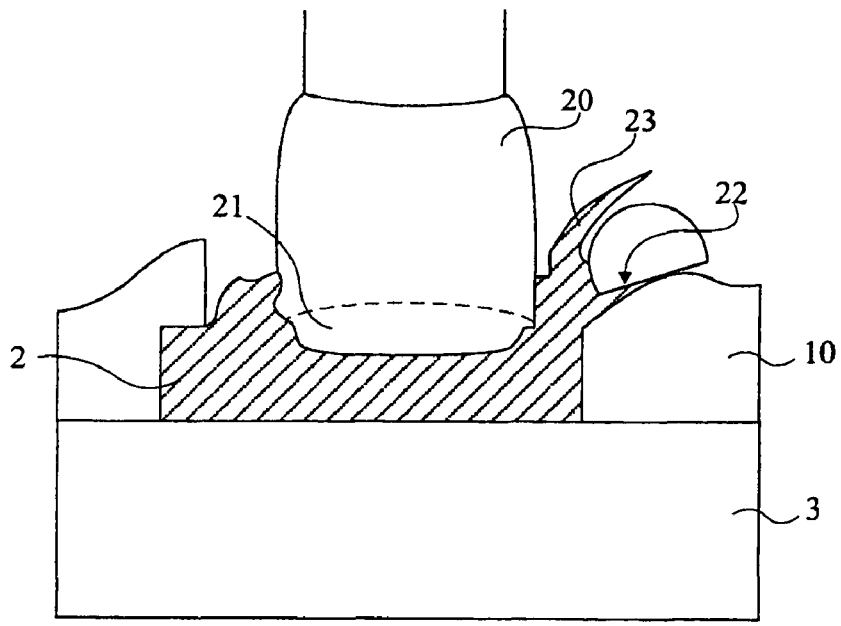
FIG. 3 is a cross-section view of the contact pad shown in FIGS. 1 and 2 after welding of a connection wire according to prior art.

For clarity, the same elements have been designated with the same reference numerals in the different drawings and, further, as usual in the representation of integrated circuits, the drawings are not to scale.

The present inventor has determined the origin of the above-mentioned reliability problems for high-density circuits. They are due to an increase in the thickness-to-width ratio of the contact pads. Indeed, to reduce the surface area taken up by conductive strips, while maintaining a resistivity which is as small as possible, the thickness of the metal layer is increased. Further, the decrease in the contact pad width also contributes to increasing the thickness-to-width ratio, which enhances reliability problems.

A decrease in the metal layer thickness can only be envisaged with difficulty since this would increase the resistivity of the conductive strips. The use of a material more conductive than aluminum, such as copper, would however make welding operations more difficult.

To solve these problems, the present invention provides placing on the last metallization level of an integrated circuit "thick" metal conductive strips and "thin" contact pads.

Figure 4:
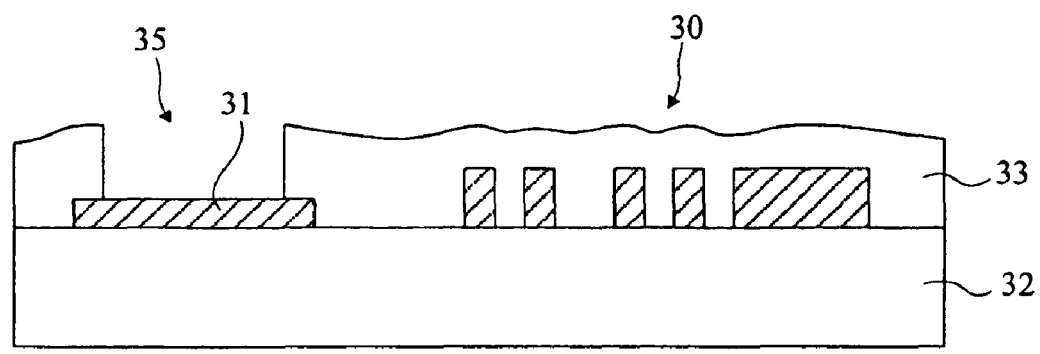
FIG. 4 is a cross-section view of an integrated circuit according to an embodiment of the present invention.

FIG. 4 is a partial cross-section view of an integrated circuit according to an embodiment of the present invention. The top view corresponding to the shown circuit portion is identical to that of FIG. 1. A coil 30 and a metal contact pad 31 are laid above a substrate 32. Five portions of coil 30 are visible. Contact pad 31 has, in this example, a substantially parallelepipedal shape. Coil 30 and substrate 32, as well as the sides and the edge of the upper surface of contact pad 31 are covered with a passivation layer 33. An opening 35 in passivation layer 33 is provided above contact pad 31.

As previously, substrate 32 is an insulating layer covering a previous metallization level or a semiconductor substrate in the case where the circuit only comprises a single metallization level. Contact pad 31 and coil 30 are formed of identical or different materials, the contact pads being currently made of aluminum.

According to the present invention, the thickness of contact pad 31 is smaller than the thickness of the metal forming coil 30. In this example, the coil has a thickness which is substantially twice that of the contact pad.

Figure 5:
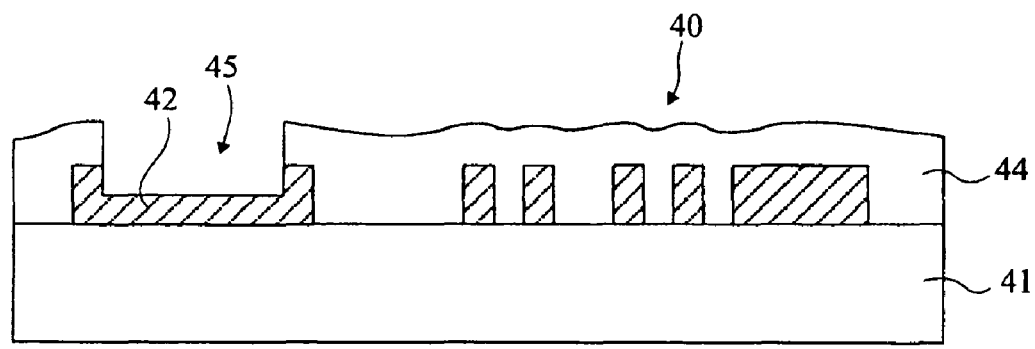
FIG. 5 is a cross-section view of an integrated circuit according to another embodiment.

FIG. 5 is a partial cross-section view of an integrated circuit according to another embodiment of the present invention.

The top view corresponding to the shown circuit portion is identical to that of FIG. 1. A coil 40 and a metal contact pad 42 are laid on a substrate 41. Coil 40, substrate 41, and connection pad 42 are covered with a passivation layer 44. An opening 45 in passivation layer 44 is also provided above connection pad 42.

The contact pad substantially has the shape of a half-box, the portions of the contact pad covered with passivation layer 44 being thicker than the exposed portions.

According to the present invention, the thickness of the portion of conductive layer 42 exposed by opening 45 is smaller than the thickness of the metal forming coil 40.

The two examples of integrated circuits shown in FIGS. 4 and 5 comprise one coil only in addition to a contact pad. However, the conductive strips formed in the last metallization level of an integrated circuit according to the present invention may have other functions. The conductive strip(s) may for example form a passive component or a network of lightly-resistive conductive lines. Generally, in an integrated circuit according to the present invention, the portions of the contact pads which are not covered by the passivation layer have a thickness smaller than that of the conductive strips placed on the last metallization level of the integrated circuit.

Figure 6:
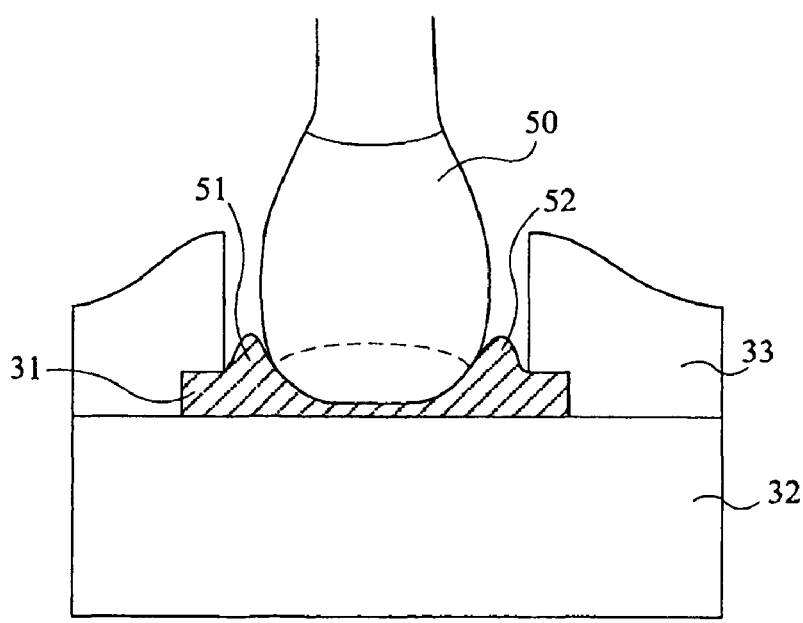
FIG. 6 is a cross-section view of the contact pad shown in FIG. 4 after welding of a connection wire.

FIG. 6 is a cross-section view of the contact pad of the circuit of FIG. 4 after welding of a metal wire. The tip of the metal wire forms a metal ball 50, conventionally made of gold, which rests on contact pad 31. Contact pad 31 has been hollowed during the welding almost down to substrate 32 and small aluminum projections have formed between ball 50 and passivation layer 33. The aluminum volume displaced in the welding process being relatively small, since the aluminum thickness is small, the pressure exerted on passivation layer 33 is small and causes no cracking. Further, the aluminum projections 51, 52 obtained on either side of ball 50 have small sizes and do not rise above passivation layer 33.

An advantage of the structure of an integrated circuit according to the present invention is that the passivation layer is not cracked at the level of the contact pads after welding of a connection wire.

Another advantage of the structure of an integrated circuit according to the present invention is that no aluminum splinter is formed at the welding of a connection wire on the contact pad.

The last metallization level of an integrated circuit according to the present invention may be formed in several ways. Two examples of methods are described hereafter.

Figure 7A:
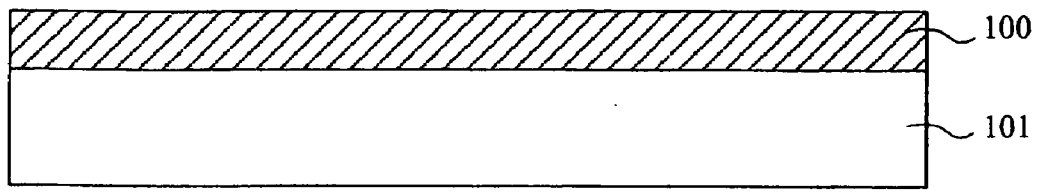
FIGS. 7A to 7E are cross-section views of structures obtained after successive steps of an implementation mode of the method of the present invention.

In a first method example, a metal layer 100 is formed on a substrate 101 having an insulating upper portion, as illustrated in FIG. 7A.

Figure 7B:
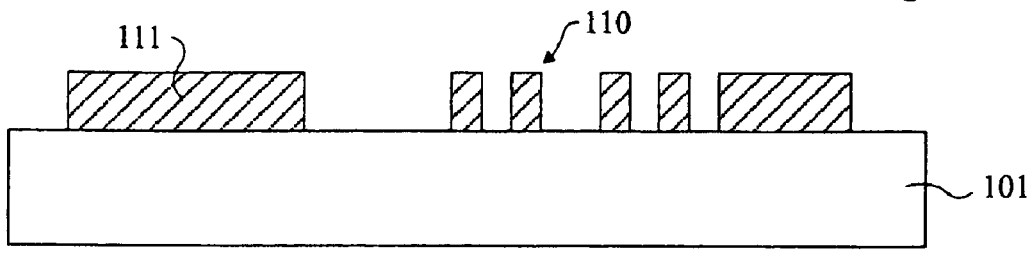

At the next step, illustrated in FIG. 7B, metal layer 100 is etched to form in this example a coil 110 and a metal portion 111. The top view of the obtained structure is identical to that of FIG. 1. Five portions of coil 110 are visible above substrate 101.

Figure 7C:
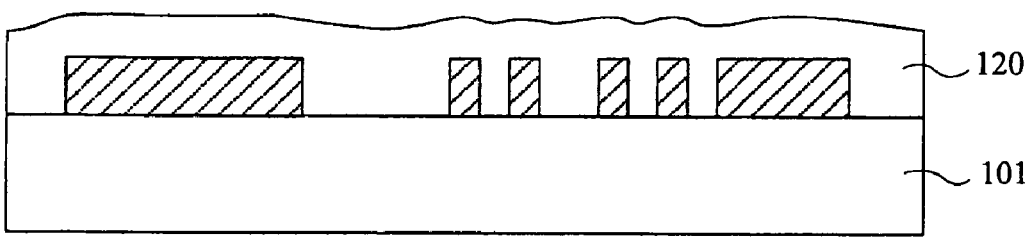

At the next step, illustrated in FIG. 7C, the entire structure is covered with a passivation layer 120.

Figure 7D:
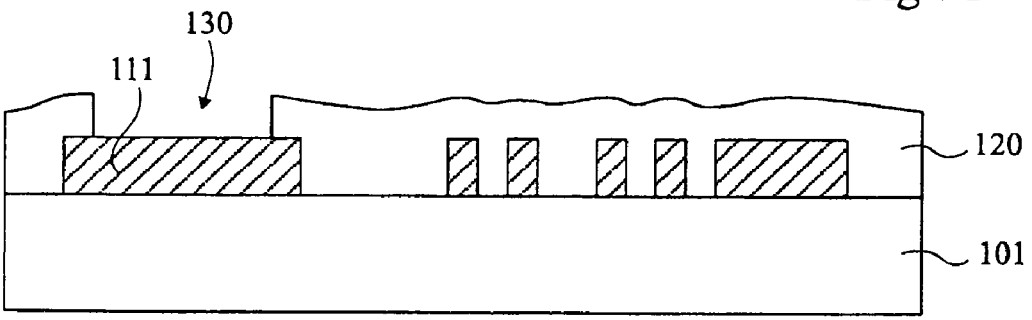

At the next step, illustrated in FIG. 7D, passivation layer 120 is etched to form an opening 130 above metal portion 111.

Figure 7E:
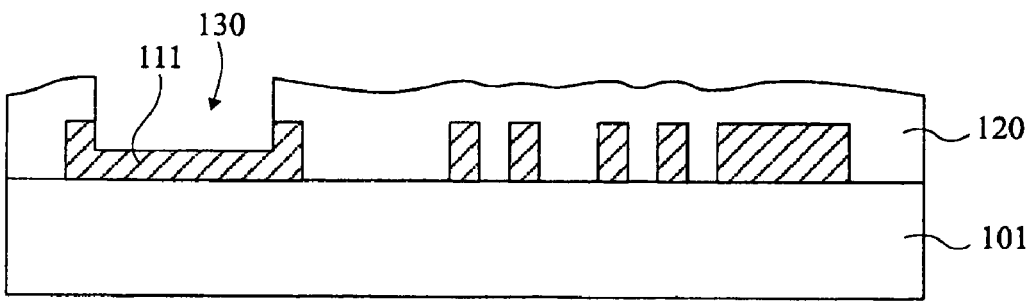

At the next step, illustrated in FIG. 7E, metal portion 111 is etched to decrease its thickness. In this example, the etching is anisotropic and only the portion of metal portion 111 uncovered by passivation layer 120 is partially etched. In this example, the thickness of the exposed portion of portion 111 is decreased by half. It will be within the abilities of those skilled in the art to define the optimal etch process enabling maintaining an "ideal" metal thickness providing a good-quality welding.

An advantage of the previously-described method is that it requires no additional mask with respect to a conventional method for forming the last metallization level of an integrated circuit.

Figure 8A:
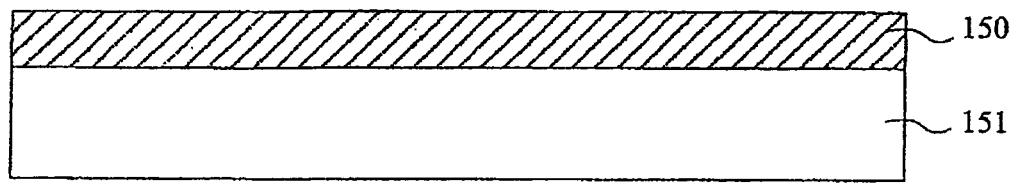
FIGS. 8A to 8E are cross-section views of structures obtained after successive steps of another implementation mode of the method of the present invention.
Figure 8B:
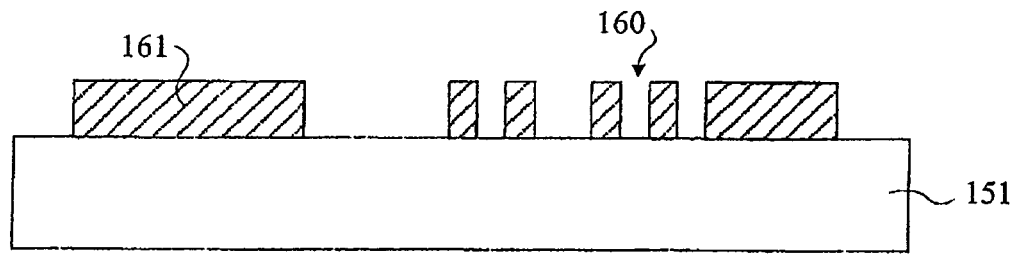

In another method example, a metal layer 150 is deposited, as previously and as shown in FIG. 8A, on a substrate 151. Metal layer 150 is then etched, as illustrated in FIG. 8B, to form a coil 160 and a metal portion 161. The top view of the obtained structure is identical to that in FIG. 1.

Figure 8C:
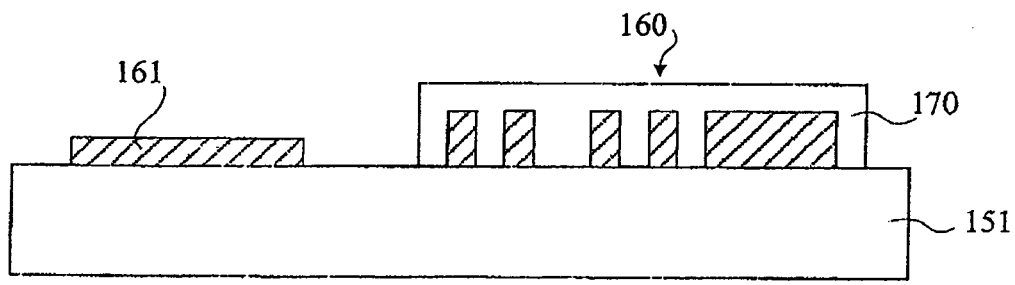

At the next step, illustrated in FIG. 8C, coil 160 is covered with a protection layer 170. Generally, all the integrated circuit elements of which the thickness of the metal layer is desired to be kept are covered. Metal portion 161 intended to form a contact pad is then etched. The etch time is determined to obtain the desired thickness for the contact pads. In this example, the contact pad thickness is decreased by half.

Figure 8D:
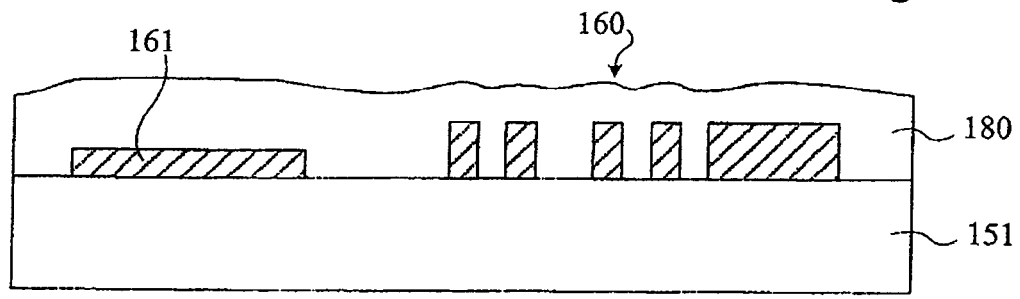
Figure 8E:
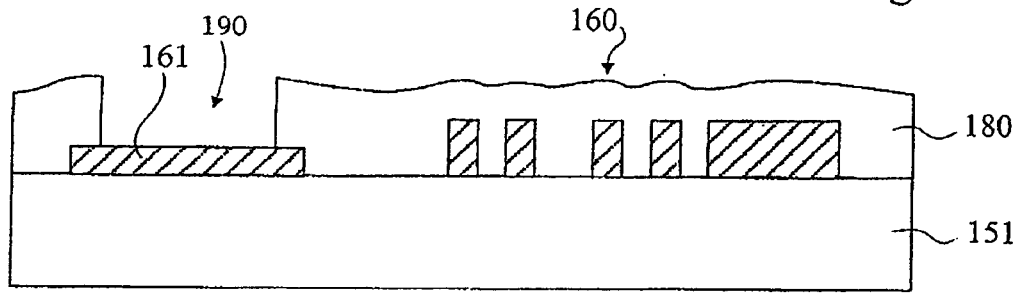

At the next step, illustrated in FIG. 8D, protection layer 170 may be removed, after which the entire structure is covered with a passivation layer 180. An opening 190 in passivation layer 180 is then formed, as illustrated in FIG. 8E, above metal portion 161. The thickness of the metal contact pad thus formed can be set independently from the thickness of the passive components or of the conductive strip networks placed on the same metallization level of the integrated circuit.

Of course, the present invention is likely to have various alterations, modifications, and improvements which will readily occur to those skilled in the art. In particular, the metal contact pads may have various shapes. Further, other methods for forming the last metallization level of an integrated circuit comprising contact pads and conductive strips of different thicknesses may be devised.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit comprising one or several metallization levels, metal conductive strips and a metal contact pad being formed on a last metallization level, wherein the metal contact pad has a first length, a first width, and a first thickness, the first thickness being the distance from a bottom of the metal contact pad to a top of the metal contact pad, wherein the first length and the first width are greater than the first thickness, the last level being covered with a passivation layer in which is formed an opening above the contact pad, wherein the metal conductive strips have a second thickness along a same direction as the first thickness, wherein the first thickness of the metal contact pad, over an entire area of the metal contact pad not covered by the passivation layer, is smaller than the second thickness of said conductive strips prior to application of an external contact to the metal contact pad, wherein the entire top of the metal contact pad within the opening has a substantially flat surface extending substantially throughout the entire opening.

2. The integrated circuit of claim 1, wherein at least one conductive strip forms a coil.

3. The integrated circuit of claim 1, wherein several of said conductive strips form a supply network.

4. The integrated circuit of claim 1, wherein the last metallization level is formed on an insulating layer, each contact pad being formed of a conductive layer covering an insulating portion laid on the insulating layer.

5. The integrated circuit of claim 1, wherein the contact pad is made of aluminum.

6. The integrated circuit of claim 1, wherein the second thickness is at least about twice as large as the first thickness.

7. A method for forming the last metallization level of the integrated circuit of claim 1, comprising:
depositing a metal layer on a substrate;
etching the metal layer to form a metal portion and said conductive strips;
covering the substrate, the conductive strips, and the metal portion with a passivation layer;
forming an opening in the passivation layer above the metal portion; and
partially etching the metal portion to decrease the thickness of the metal portion to obtain said contact pad; wherein a first thickness over an entire area of the metal contact pad not covered by the passivation layer, is smaller than a second thickness of said conductive strips.

8. A method for forming the last metallization level of the integrated circuit of claim 1, comprising:
depositing a metal layer on a substrate;
etching the metal layer to form a metal portion and said conductive strips;
covering the conductive strips with a protection layer;
partially etching the metal portion to decrease the thickness of the metal portion to obtain said contact pad;
removing, if necessary, the protection layer;
covering the substrate, the conductive strips, and the contact pad with a passivation layer; and
forming an opening in the passivation layer above the contact pad; wherein the thickness over an entire area of the metal portion not covered by the passivation layer, is smaller than a second thickness of said conductive strips.

* * * * *